(12) United States Patent
Chu et al.

(10) Patent No.: US 9,793,338 B2
(45) Date of Patent: Oct. 17, 2017

(54) CAPACITOR STRUCTURES FOR SEMICONDUCTOR DEVICE

(75) Inventors: Tsui Ping Chu, Kuching (MY); Peng Yang, Kuching (MY); Evie Siaw Hei Kho, Kuching (MY); Yong Kheng Ang, Kuching (MY); Swee Hua Tia, Kuching (MY)

(73) Assignee: X-FAB SEMICONDUCTOR FOUNDRIES AG, Erfurt (DE)

( * ) Notice: Subject to any disclaimer, the term of this patent is extended or adjusted under 35 U.S.C. 154(b) by 0 days.

(21) Appl. No.: 13/810,398

(22) PCT Filed: Jul. 16, 2010

(86) PCT No.: PCT/EP2010/060366
§ 371 (c)(1),
(2), (4) Date: Feb. 11, 2013

(87) PCT Pub. No.: WO2012/007060
PCT Pub. Date: Jan. 19, 2012

(65) Prior Publication Data
US 2013/0140677 A1    Jun. 6, 2013

(51) Int. Cl.
*H01L 29/49* (2006.01)
*H01L 49/02* (2006.01)
(Continued)

(52) U.S. Cl.
CPC ............ *H01L 28/60* (2013.01); *H01G 7/06* (2013.01); *H01L 27/0802* (2013.01); *H01L 28/40* (2013.01)

(58) Field of Classification Search
CPC ..... H01L 28/60; H01L 27/0802; H01L 28/40; H01G 7/06
(Continued)

(56) References Cited

U.S. PATENT DOCUMENTS 6,069,050 A * 5/2000 Hou .................... H01L 27/0805
257/E27.048
6,680,521 B1 * 1/2004 Kar-Roy et al. .............. 257/532
(Continued)

FOREIGN PATENT DOCUMENTS

WO    2008047000 A2    4/2008

OTHER PUBLICATIONS

International Search Report for corresponding application No. PCT/EP2010/060366 filed Jul. 16, 2010; dated Mar. 24, 2011.
(Continued)

*Primary Examiner* — Michael Shingleton
(74) *Attorney, Agent, or Firm* — Nixon & Vanderhye PC

(57) ABSTRACT

A semiconductor device comprising a semiconductor substrate and a composite capacitor structure on the semiconductor substrate, wherein the composite capacitor structure comprises a capacitor stack comprising a lower and an upper capacitor, respectively comprising first and second dielectric materials, wherein the first and second dielectric materials are different materials and/or have different thicknesses from each other. This can minimize the voltage dependence of the capacitance of the composite capacitor structure. It is also possible to provide a composite capacitor structure on the semiconductor substrate, wherein the composite capacitor structure comprises at least a first and a second capacitor stack, each comprising a lower and an upper capacitor. The capacitors can be MIM capacitors.

13 Claims, 8 Drawing Sheets

(51) Int. Cl.
*H01G 7/06* (2006.01)
*H01L 27/08* (2006.01)

(58) Field of Classification Search
USPC .......................... 257/306, E21.646, E27.085
See application file for complete search history.

(56) References Cited

U.S. PATENT DOCUMENTS

| | | |
|---|---|---|
| 2006/0124987 A1 | 6/2006 | Won |
| 2007/0228506 A1 | 10/2007 | Min |
| 2008/0160712 A1 | 7/2008 | Park |
| 2008/0310065 A1 | 12/2008 | Ho |
| 2009/0057741 A1* | 3/2009 | Sim ............................... 257/306 |

OTHER PUBLICATIONS

Written Opinion for corresponding application No. PCT/EP2010/060366 filed Jul. 16, 2010; dated Mar. 24, 2011.

Sin Jung Kim et al., "Improvement of Voltage Linearity in High-k MIM Capacitors Using HfO2-SiO2 Stacked Dielectric," IEEE Electron Device Letters, vol. 25, No. 8, Aug. 2004, pp. 538-540.

* cited by examiner

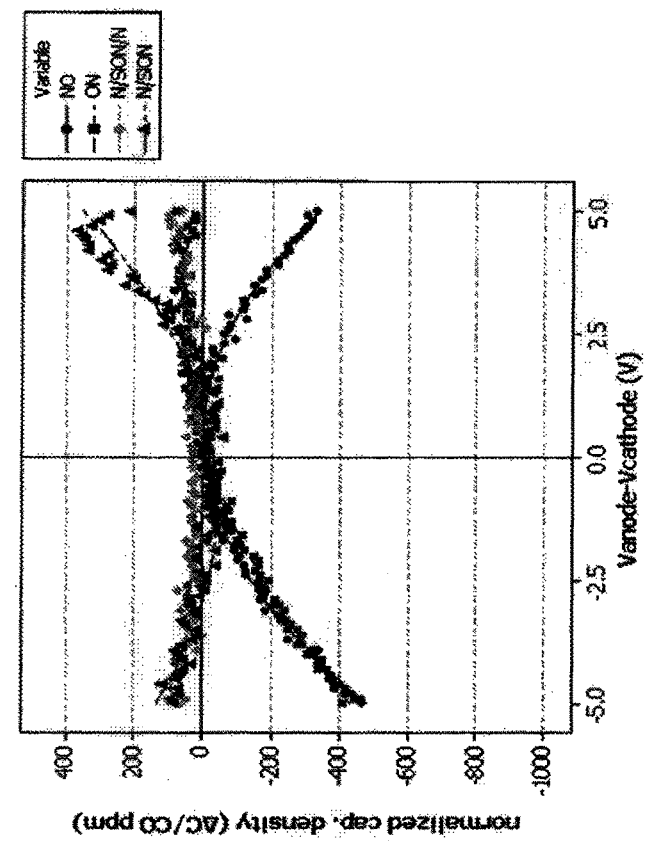
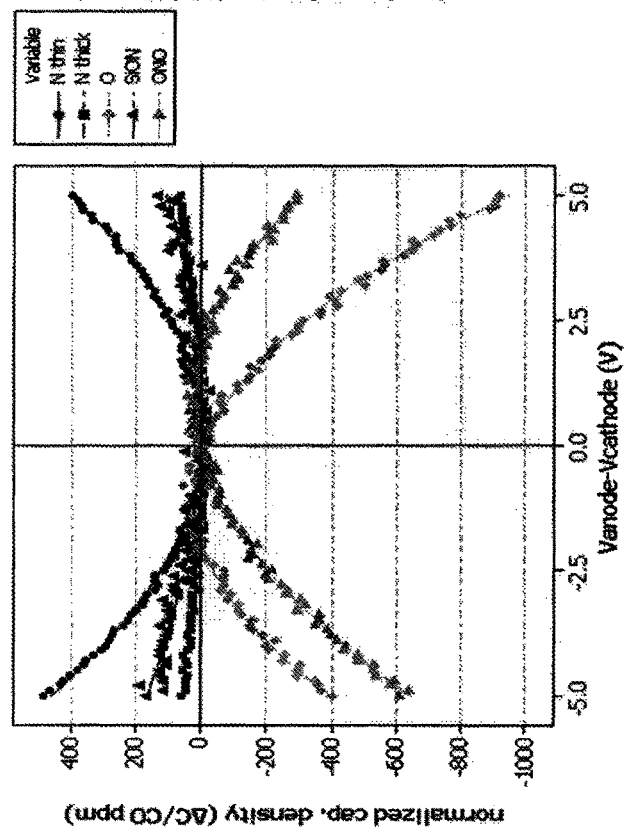
Fig. 1A
Fig. 1B

CAPACITOR STRUCTURES FOR SEMICONDUCTOR DEVICE

The present invention relates to capacitor structures, in particular on a semi-conductor substrate. The invention finds particular application in MIM (Metal-Insulator-Metal) capacitors, although it is not limited thereto.

U.S. Pat. No. 6,680,521 B1 entitled "High Density Composite MIM Capacitor with reduced voltage dependence in semiconductor dies" discloses the layout of a stack MIM. The stack MIM is formed with an upper and a lower capacitor, and these are connected to each other in a way which results in good voltage linearity.

The present inventors have devised a technique for improving the voltage linearity further. Accordingly, some embodiments aim to provide a capacitor structure having an improved voltage linearity. Other embodiments do not necessarily improve the voltage linearity but aim to provide a capacitor structure with good capacitance density. Other embodiments aim to provide a capacitor structure which enables the voltage coefficients of capacitance (VCC) of the structure to be manipulated in order to achieve a desired effect.

In one aspect, the present invention provides a semiconductor device comprising: a semiconductor substrate; a composite capacitor structure on the semiconductor substrate, wherein the composite capacitor structure comprises a capacitor stack comprising a lower and an upper capacitor, respectively comprising first and second dielectric materials, wherein the first and second dielectric materials are different materials and/or have different thicknesses from each other.

In another aspect, the present invention provides a semiconductor device comprising: a semiconductor substrate; a composite capacitor structure on the semiconductor substrate, wherein the composite capacitor structure comprises at least a first and a second capacitor stack, each comprising a lower and an upper capacitor.

Some preferred embodiments of the invention will now be described by way of example only and with reference to the accompanying drawings, in which:

FIGS. 1A and 1B show normalized C-V (capacitance vs. bias voltage) curves for various dielectrics.

In the area of mixed signal analog application devices, precise performance of passive devices is often required across different technologies. The quality of passive components such as filters, mixers, dividers, converters . . . etc, is often as important as the characteristics of active devices in amplifiers, oscillators . . . etc. MIM (metal-insulator-metal) capacitors are widely used, as compared to PIP (poly-insulator-poly) or MOS devices (varactors), as the latter two tend to exhibit depletion effects. The associated parasitic capacitance can cause undesirable capacitance variations with voltage bias fluctuations. The metal plates of MIM capacitors can provide depletion-free, high-conductance electrodes suitable for high speed applications at low cost. The quality of MIM capacitors depends on a combination of having a high capacitance (storing electrical energy in the form of electrical charges) without occupying too much area, i.e. unit capacitance density. The stability of the MIM can be regarded as the ability to maintain precise values independent of operating conditions. Shifts in capacitance with different operating frequencies, known as dispersion, can lead to high distortion in analog signals. Linearity determines the changes in capacitance with the bias voltage. As such, for high performance analog circuits, MIM desirable characteristics are low voltage and thermal linearity, non-dispersive characteristics, low leakage, high capacitance density as well as high breakdown field strength.

Figure 4:
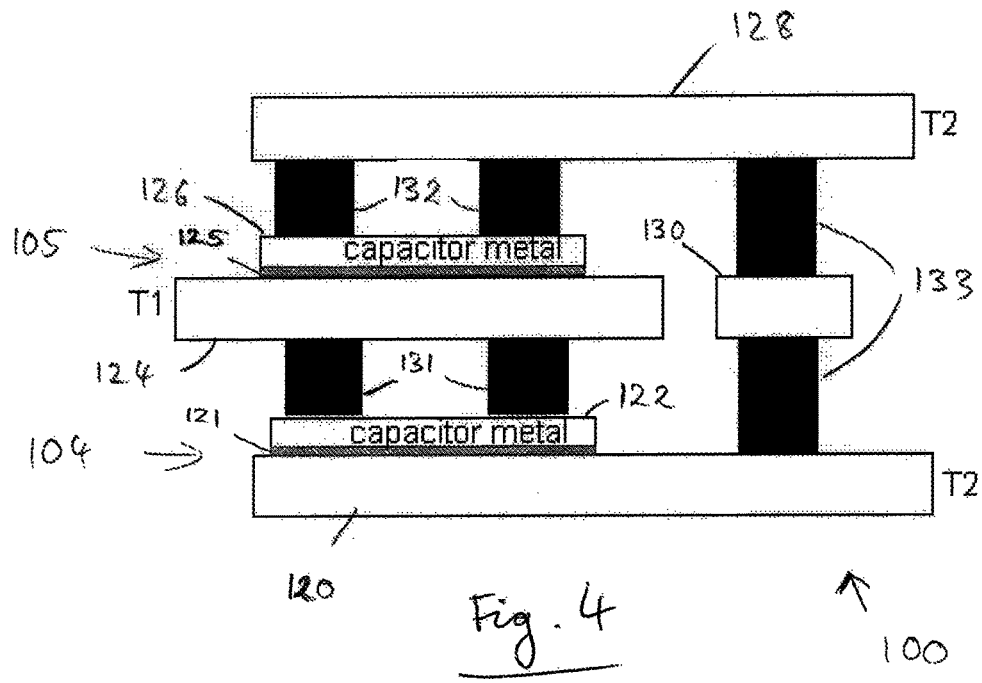
FIG. 4 is a schematic section through a capacitor structure according to an embodiment of the present invention.

For a fuller understanding of the first embodiment shown in FIG. 4, an explanation of a capacitance model is provided first.

In general, the normalized capacitance can be modelled as follows:

$$\frac{dC}{C_O} = \frac{C(V) - C_O}{C_O} \alpha V^2 + \beta V \quad (1)$$

where Co is the capacitance at zero voltage and V is the voltage applied between the MIM electrodes. α and β are the quadratic and linear coefficients of the MIM capacitor in ppm/V² and ppm/V respectively. FIGS. 1A and 1B show normalised C-V (capacitance vs. bias voltage) curves for various dielectrics.

Figure 2:
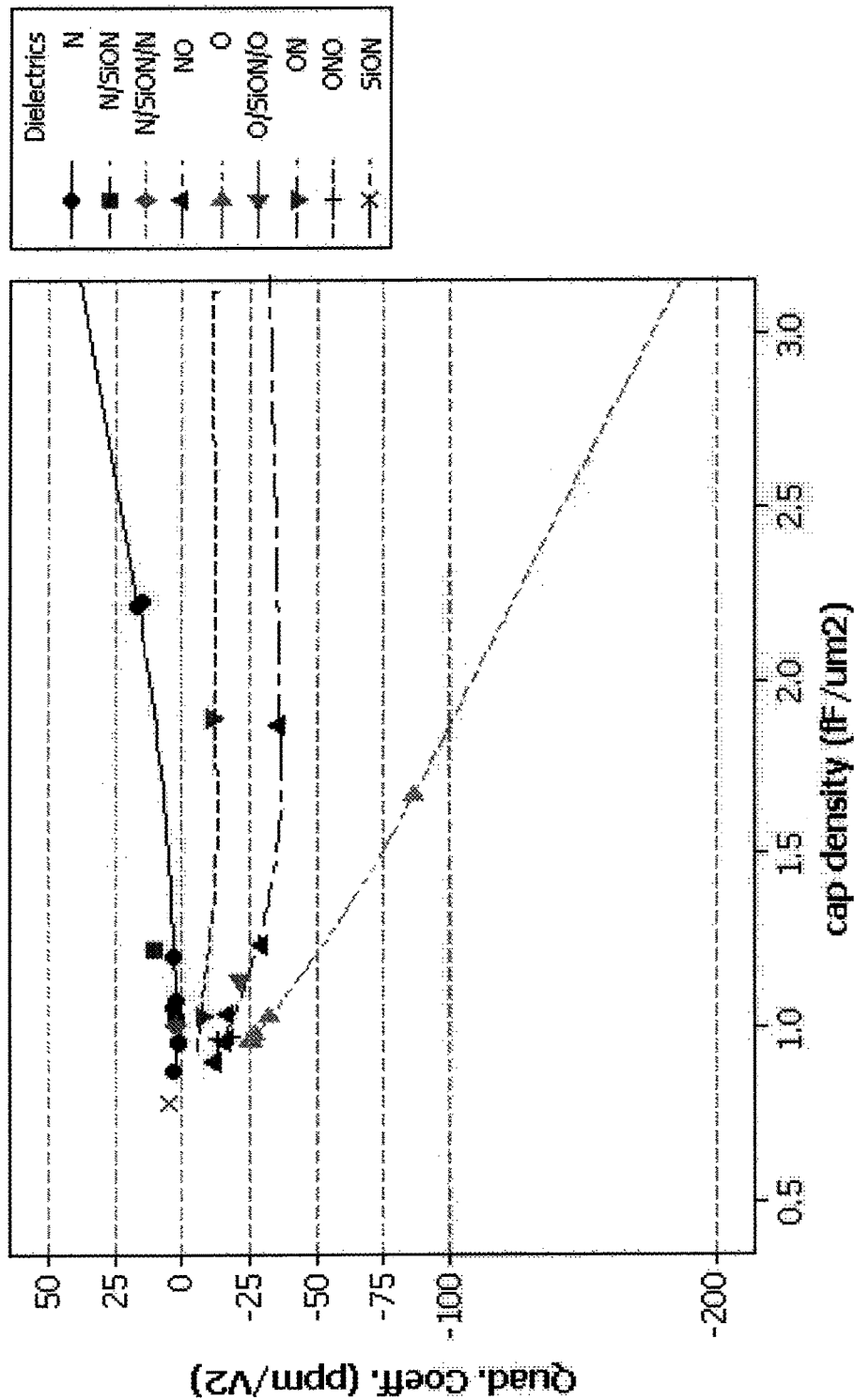
FIG. 2 shows a graph indicating the quadratic coefficient (α) of the voltage linearity of capacitance for different dielectrics in a single layer MIM.
Figure 3:
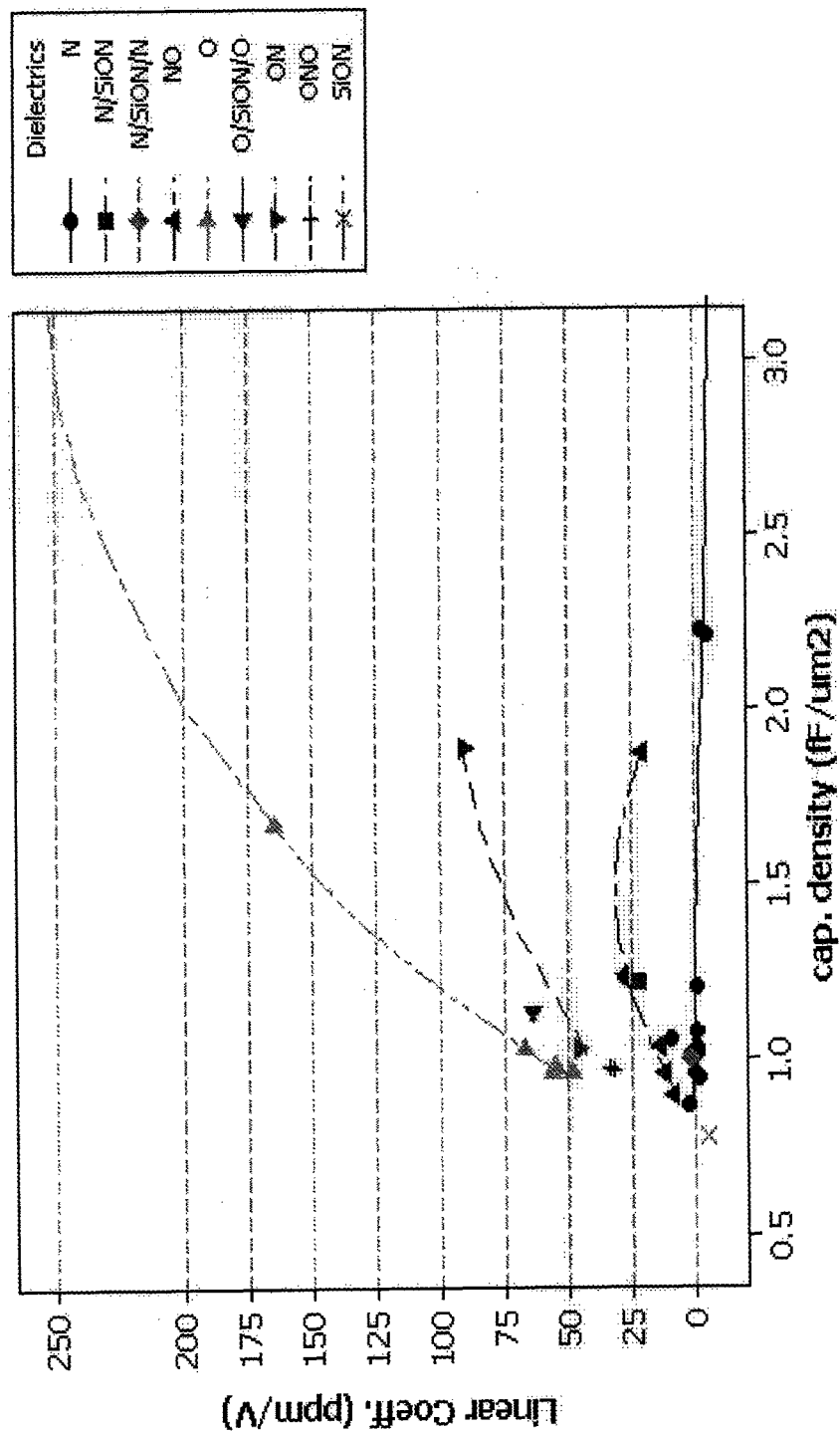
FIG. 3 shows a graph indicating the linear coefficient (β) of the voltage linearity of capacitance for different dielectrics in a single layer MIM.

A trade off relationship is usually observed for the capacitance density and voltage coefficients. In other words, it is difficult to achieve both high capacitance density as well as low VCC, as shown in FIGS. 2 and 3.

The reader is referred to above-mentioned U.S. Pat. No. 6,680,521, as regards a calculation of the overall capacitance of the capacitor stack disclosed in this patent. This document is incorporated herein by reference in its entirety for all purposes.

FIG. 4 shows a section through a capacitor structure according to an embodiment of the present invention. The capacitor structure 100 appears similar to the structure disclosed in U.S. Pat. No. 6,680,521, and one skilled in the art will understand, based on the disclosure of this patent and the teaching of the present specification (as well as general knowledge) how a capacitor structure shown in FIG. 4 could be manufactured.

The capacitor structure 100 has lower and upper capacitors 104 and 105. The lower capacitor 104 is formed with a bottom plate 120 and a top plate 122 with a dielectric material 121 therebetween. Similarly, the upper capacitor 105 is formed with a bottom plate 124 and a top plate 126 with dielectric material 125 therebetween. In the example shown in FIG. 4, the top and bottom plates are made from metal, and the capacitor structure is constructed on a semiconductor substrate.

The top plate 122 of the lower capacitor 104 is connected to the bottom plate 124 of the upper capacitor 105 by means of metallic material 131 located in vias. The capacitor structure 100 is provided with an additional plate 128 located above the upper capacitor 105. The additional plate 128 extends laterally beyond the upper capacitor 105. The additional plate 128 is connected to the top plate 126 of the upper capacitor 105 by means of metallic material 132 located in vias, generally above metallic material 131. Further, the additional plate 128 is connected to the bottom plate 120 of the lower capacitor 104 by means of metallic material 133 located in vias and metallic material 130.

Figure 5:
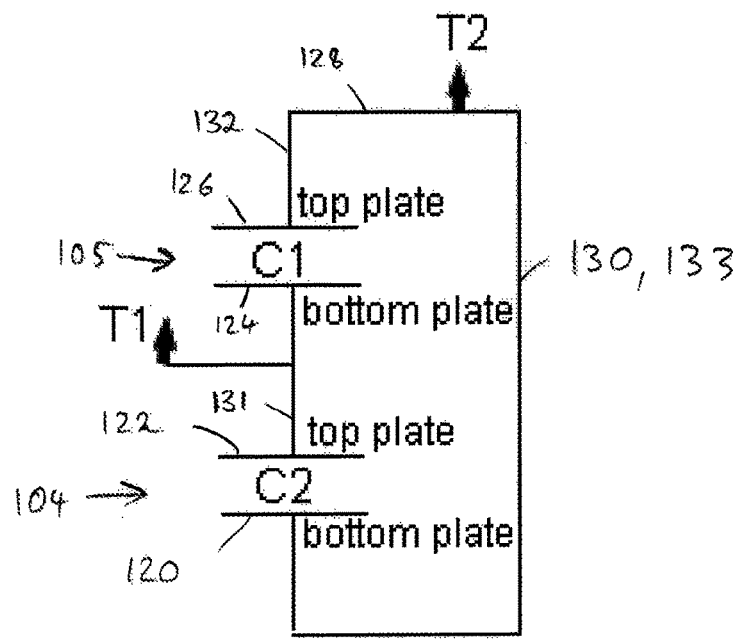
FIG. 5 is a circuit diagram equivalent to the capacitor structure of FIG. 4.

FIG. 5 shows a circuit diagram equivalent to the capacitor structure of FIG. 4. Two contact points T1 and T2 are indicated in FIGS. 4 and 5, for external connection. In relation to the external connections T1 and T2, the upper and lower capacitors 105 and 104 are connected in parallel.

Given that the two terminals T1 and T2 of the stack capacitor 100 are placed such that the upper and lower capacitors 105 and 104 are connected in parallel, the total capacitance of the stack capacitor 100 is equal to the sum of the capacitances of the upper and lower capacitors respectively, i.e. $C_T = C_1 + C_2$, whereby the index T refers to the (total) capacitor structure 100, and the indexes "1" and "2" relate to the upper and lower capacitors 105 and 104.

Using the above equation (1), the capacitance of the upper and lower capacitors can be modelled as follows:

$$\frac{dC_i}{C_{iO}} = \frac{C_i(V) - C_{iO}}{C_{iO}} = \alpha_i V^2 + \beta_i V, \quad (2)$$
$$i = 1, 2$$

Bearing in mind that the total capacitance of capacitor stack 100 is equal to the sum of the upper and lower capacitors 105 and 104, the voltage coefficients for the total (or composite) capacitor 100 become:

$$\alpha_T = \frac{C_{1O}\alpha_1 + C_{2O}\alpha_2}{C_{1O} + C_{2O}}; \quad \beta_T = \frac{C_{1O}\beta_1 + C_{2O}\beta_2}{C_{1O} + C_{2O}} \quad (3), (4)$$

The present inventors have found that the resultant voltage coefficients of the composite capacitor structure 100 can be optimised (i.e. minimised) by appropriate choice of different materials as dielectric materials 121 and 125 respectively of the lower and upper capacitors. The inventors have in particular found that, if dielectric materials are chosen with opposite signs of voltage coefficients, the resultant voltage coefficients $\alpha_T$ and $\beta_T$ can have ultra low values.

The inventors have found that using oxide and nitride as dielectric materials is particularly advantageous.

The thickness of the dielectric materials 121 and 125 also influences the total capacitance and the voltage coefficients of the capacitor stack 100. In any event, the capacitance density of the stack capacitor 100 is increased when compared with a single (non-stacked) capacitor. If dielectrics 121 and 125 were made from the same material and had the same thickness, then the total capacitance would be doubled when compared with a single capacitor.

The breakdown voltage $BV_T$ of the composite capacitor 100 is the smaller of the breakdown voltages of the upper and lower capacitors 105 and 104, i.e.:

$$BV_T = \min(BV_1, BV_2) \quad (5)$$

Figure 6B:
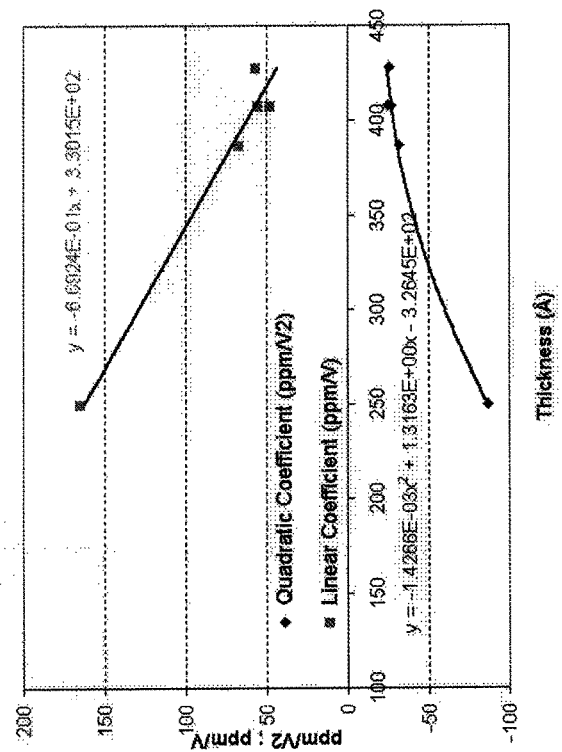
FIG. 6B is a graph illustrating the linearity performance (quadratic and linear voltage coefficients of capacitance) in dependence on the dielectrics thickness for oxide.
Figure 6A:
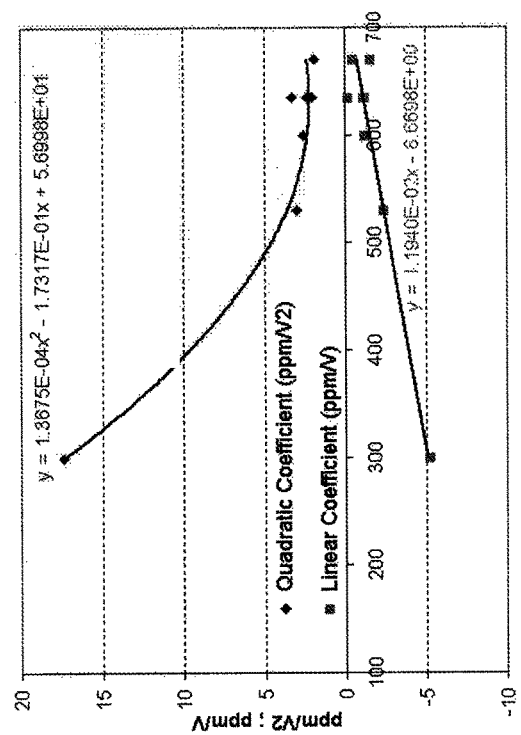
FIG. 6A is a graph illustrating the linearity performance (quadratic and linear voltage coefficients of capacitance) in dependence on the dielectrics thickness for nitride.
Figure 7B:
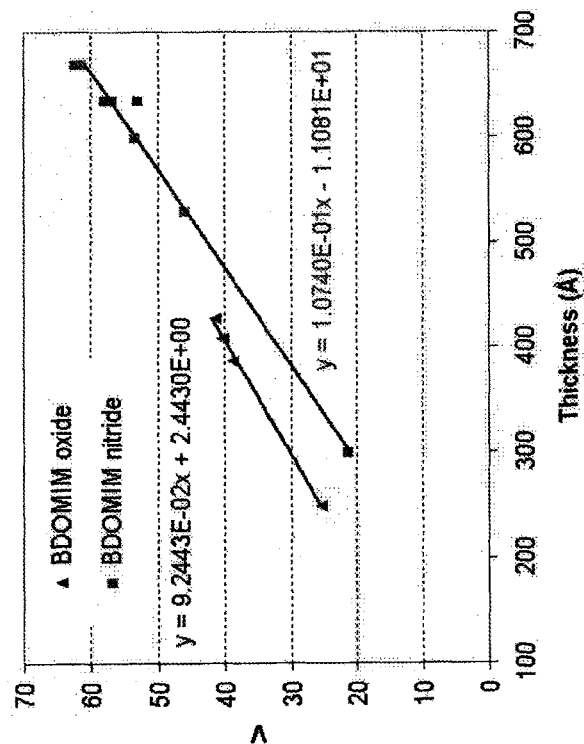
FIG. 7B is a graph illustrating the breakdown voltage for nitride and oxide in a MIM capacitor.
Figure 7A:
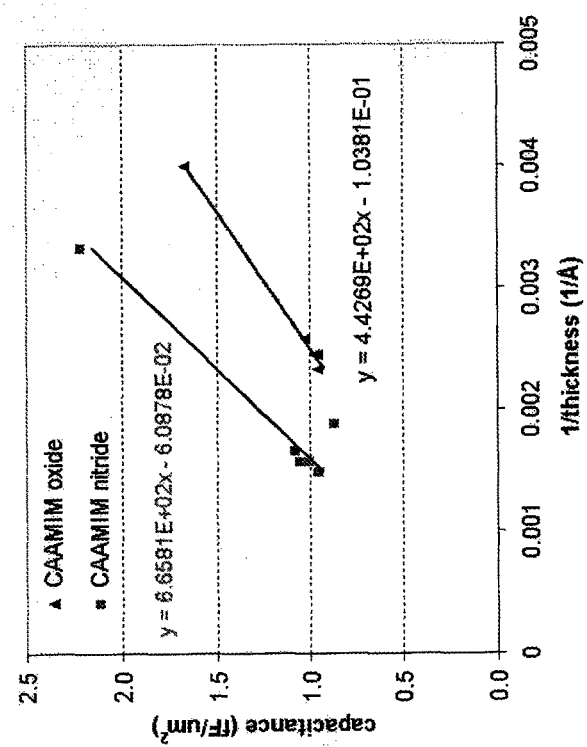
FIG. 7A is a graph illustrating the capacitance density for nitride and oxide in a MIM capacitor.

FIGS. 6A and 6B show the characteristics curves for the linearity performance (vertical axis) in dependence on the dielectric thickness (horizontal axis), respectively for nitride and oxide. The electrical properties, capacitance density and breakdown voltage are respectively shown in FIGS. 7A and 7B for oxide and nitride.

The voltage coefficients $\alpha_T$ and $\beta_T$, as well as the capacitance density $C_T$ and the breakdown voltage $BV_T$ can be optimised using the above equations and choosing appropriate materials and thicknesses. The table below lists examples of combinations of the dielectrics thicknesses using oxide and nitride respectively for the upper and lower capacitors and indicating resultant values for the stack capacitor. The values are expressed in the following units: Cx capacitance density in fF/μm²; αx quadratic voltage coefficients in ppm/V²; βx linear voltage coefficients in ppm/V; x refers to N: nitride; O: oxide; S: Stack.

| Dielectric THK(Å) | | Nitride | | | | Oxide | | | | Stack MIM | | | |
|---|---|---|---|---|---|---|---|---|---|---|---|---|---|
| Nitride | Oxide | $C_N$ | $BV_N$ | $\alpha_N$ | $\beta_N$ | $C_O$ | $BV_O$ | $\alpha_O$ | $\beta_O$ | $C_S$ | $BV_S$ | $\alpha_S$ | $\beta_S$ |
| 380 | 480 | 1.69 | 29.7 | 10.9 | −4.1 | 0.82 | 46.8 | −23.3 | 8.9 | 2.51 | 29.7 | −0.23 | 0.12 |
| 300 | 450 | 2.16 | 21.1 | 17.4 | −5.1 | 0.88 | 44.0 | −23.0 | 29.0 | 3.04 | 21.1 | 5.67 | 4.78 |
| 300 | 408 | 2.16 | 21.1 | 17.4 | −5.1 | 0.98 | 40.2 | −26.9 | 57.1 | 3.14 | 21.1 | 3.53 | 14.3 |
| 200 | 300 | 3.27 | 10.4 | 27.8 | −6.3 | 1.37 | 30.2 | −60.0 | 129.4 | 4.64 | 10.4 | 1.88 | 33.8 |
| 180 | 275 | 3.64 | 8.3 | 30.3 | −6.5 | 1.51 | 27.9 | −72.4 | 146.1 | 5.14 | 8.3 | 0.22 | 38.2 |
| 160 | 260 | 4.10 | 6.1 | 32.8 | −6.8 | 1.60 | 26.5 | −80.7 | 156.1 | 5.70 | 6.1 | 0.97 | 38.9 |

From the above table it is apparent that a stack capacitor can be manufactured with a relatively high capacitance density of about 5 fF/μm² and having a quadratic term in VCC<1 ppm/V².

It will be appreciated from the above description that certain embodiments enable the voltage dependence of the capacitance of the composite stack capacitor to be minimized by choosing different dielectrics with different thicknesses respectively for the upper and lower capacitor, in particular by choosing materials having VCCs of opposite signs. However, in certain scenarios it may be unnecessary or not even desirable to minimize the voltage dependence of the composite capacitor, and accordingly embodiments are provided where the dielectrics of the upper and lower capacitors 105 and 104 are made from different materials but have the same thickness, or are made from the same material but have different thicknesses. These embodiments are still expected to result in a composite capacitor having a higher capacitance density than a single capacitor.

Figure 8:
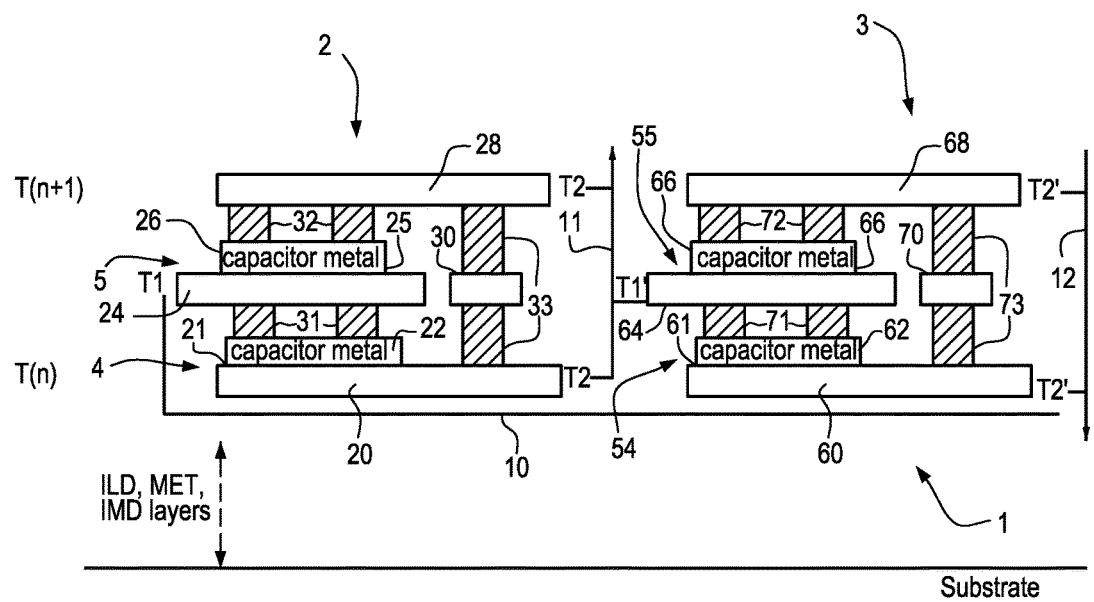
FIG. 8 is a schematic section through a capacitor structure according to an embodiment of the present invention.
Figure 9:
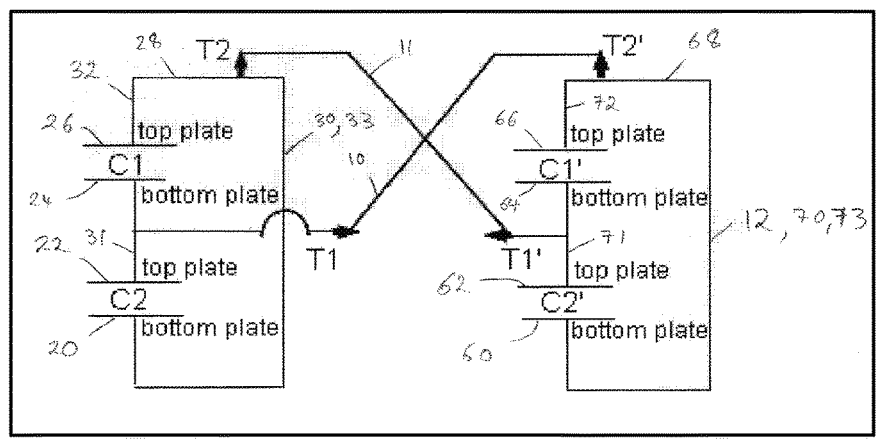
FIG. 9 is a circuit diagram equivalent to the capacitor structure of FIG. 8.

FIG. 8 shows a further embodiment of a composite capacitor structure 1. This comprises first and second capacitor stacks 2 and 3, each of which are similar in construction to the capacitor stack shown in FIG. 4. Like features carry like reference signs and have a corresponding function. However, the external connections are different from those shown in FIGS. 4 and 5. In the FIG. 8 embodiment, the bottom plate 24 of the upper capacitor 5 of the first capacitor stack 2 is electrically connected (contact T1) to the bottom plate 60 of the lower capacitor 54 of the second capacitor stack 3 (at contact T2'). This in turn is connected to the additional plate 68 of the second capacitor stack 3 by means of metallic materials 73 and 70. Further, the bottom plate 20 of the lower capacitor 4 of the first capacitor stack 2 is connected (T2) to the additional plate 28 of the first capacitor stack 2 by means of metallic material 33 and 30. These plates are also connected to the bottom plate 64 of the upper capacitor 55 of the second capacitor stack 3 at contact T1'. An equivalent electrical circuit diagram is shown in FIG. 9. As can be seen from FIG. 9, if for example, contact points T1 and T2 are considered to be contacts of the composite capacitor 1 for external connection, then all of the four individual capacitors are connected in parallel. With the two capacitor stacks 2 and 3 connected to each other with their terminals cross-wired (T1 to T2', T2 to T1') as shown in FIGS. 8 and 9, the linear coefficients of the individual capacitors cancel each other out since respective pairs of the individual transistors are biased in opposite directions. Accordingly, the resultant $\beta_T$ can be further reduced.

Given the structure shown in FIGS. 8 and 9, inter alia the following variants are possible:
1. All four individual capacitors use the same material with the same thickness for the dielectric materials 21, 25, 61 and 65.
2. The dielectric materials 25 and 65 are made from a first material, and the dielectric materials 21 and 61 are made from a second, different, material. All four dielectrics may or may not have the same thickness.
3. The dielectric materials 25 and 65 have a first thickness, and the dielectric materials 21 and 61 have a second, different, thickness from the first. The materials of the four individual capacitors may or may not be the same.
4. The dielectric materials 21 and 25 are made from a first material, and the dielectric materials 61 and 65 are made from a second, different, material. All four dielectrics may or may not have the same thickness.
5. The dielectric materials 21 and 25 have a first thickness, and the dielectric materials 61 and 65 have a second, different, thickness from the first. The materials of the four individual capacitors may or may not be the same.

Figure 10:
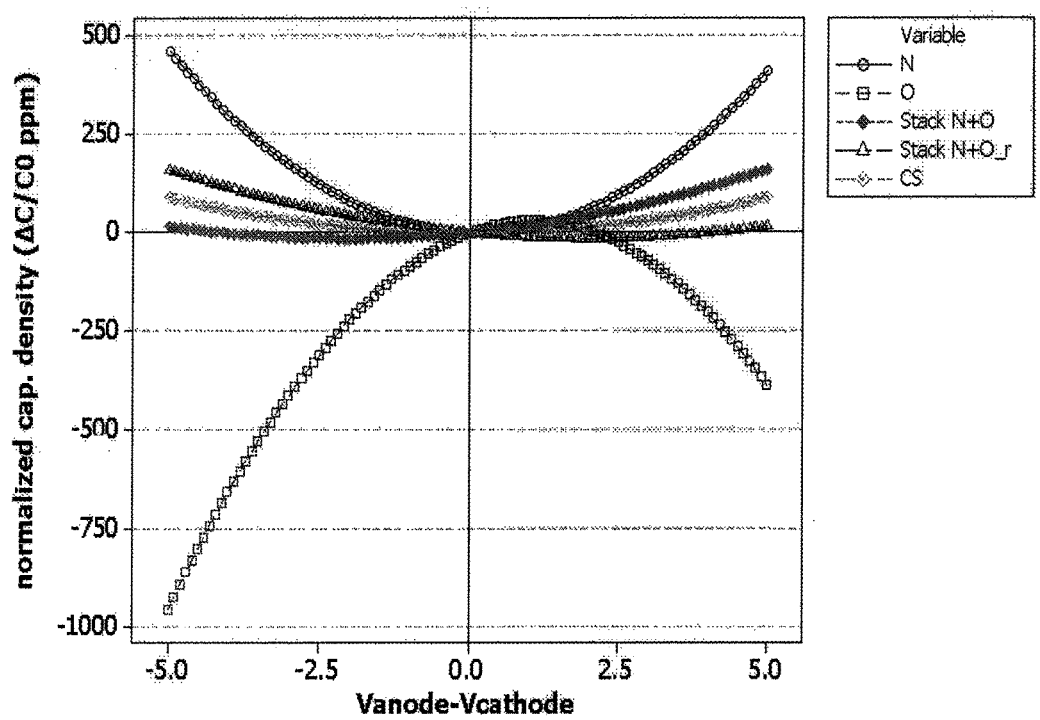
FIG. 10 is a graph illustrating the resultant normalised capacitance density for particular embodiments of a capacitor structure constructed according to FIG. 8.

FIG. 10 illustrates capacitance density in dependence on applied voltage based on an example of a composite capacitor according to FIG. 8, whereby the lower capacitors 4 and 54 use oxide as dielectric materials, and the upper capacitors 5 and 55 use nitride as dielectric material. The respective thicknesses of the dielectric materials were chosen to be 408 Angstrom (40.8 nm) for oxide and 300 Angstrom (30 nm) for nitride so that the quadratic and linear voltage coefficients and the capacitance density of the individual capacitors were as follows:

$\alpha(\text{oxide})=-26.9 \text{ ppm/V}^2; \beta(\text{oxide})=57.1 \text{ ppm/V};$
$C_{ox}=0.98 \text{fF/}\mu\text{m}^2;$ $\alpha(\text{nitride})=17.4 \text{ ppm/V}^2; \beta(\text{nitride})=-5.1 \text{ ppm/V};$
$C_{nit}=2.16 \text{fF/}\mu\text{m}^2;$ This corresponds to line 3 of the above table. The capacitance density in dependence on applied voltage for each individual capacitor 4, 5, 54, 55 is represented by circles (nitride) and squares (oxide) in FIG. 10.

For each capacitor stack 2 and 3, the resultant quadratic and linear voltage coefficients and capacitance density became:

$\alpha(\text{stack})=3.53 \text{ ppm/V}^2; \beta(\text{stack})=14.3 \text{ ppm/V};$
$C_{stack}=3.14 \text{fF/}\mu\text{m}^2;$ This is represented by the curves "Stack N+O" (filled-in diamonds) and "Stack N+O_r" (triangles) in FIG. 10. The suffix "_r" indicates that the voltage of one of the stack capacitors is applied in reverse when compared with the other stack capacitor, as results from the "cross-coupling" of the two stacks 2, 3 by means of lines 10, 11 (see in particular FIG. 9).

By cross-coupling the stack capacitors 2 and 3 as per FIGS. 8 and 9, the linear term 13 of the voltage coefficient of the composite capacitor structure 1 was significantly reduced further, or virtually eliminated. The cross-coupled capacitor structure had a quadratic voltage coefficient $\alpha_{CS}$ of 3.5 ppm/V$^2$, with $\alpha_{CS}$ having been reduced to 0 for most practical purposes. The capacitance density $C_{CS}$ of the cross-coupled capacitor structure was 3.04 fF/$\mu$m$^2$. This is represented by the curve "CS" (empty diamonds) in FIG. 10.

It will be understood that other combinations of dielectric materials and/or thicknesses will reduce or virtually cancel the voltage coefficients of the composite capacitor, and one skilled in the art will not have any difficulties to identify such combinations, using the present specification as guidance.

Whilst complete capacitor structures and their wiring have been described above, it will be appreciated that the invention extends to "incomplete" capacitor structures and complete or incomplete capacitor structures without their wiring. For example, the invention extends to embodiments similar to the FIG. 4 embodiment but with the additional plate 128 and possibly some or all of the metallic material 130, 132 and 133 omitted. Capacitor structures according to such embodiments may be useful when used in combination with other devices which complete the connections as per the FIG. 4 embodiment. It is also conceivable that wiring and/or the additional plate 128 and metallic material 130, 132 and 133 is retro-fitted to such an "incomplete" capacitor structure. Similar considerations apply with respect to other embodiments disclosed herein.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:
1. A semiconductor device comprising:
   a semiconductor substrate; and
   a composite capacitor structure on the semiconductor substrate, wherein the composite capacitor structure comprises at least a first and a second capacitor stack, each comprising a lower and an upper capacitor, wherein a first terminal of the lower capacitor in the first capacitor stack is connected to a second terminal of the upper capacitor in the second capacitor stack and a first terminal of the lower capacitor in the second capacitor stack is connected to a second terminal of the upper capacitor in the first capacitor stack;

wherein the upper capacitor of the first stack is configured to be biased in the opposite direction to the upper capacitor of the second stack and the lower capacitor of the first stack is configured to be biased in the opposite direction to the lower capacitor of the second stack; and wherein the semiconductor device is configured according to one of the following two configurations:

(i) dielectric material of the upper capacitor of the first and second stacks comprises a first dielectric material having a selected thickness, and the dielectric material of the lower capacitor of the first and second stacks comprises a second dielectric material having a selected thickness, wherein the first and second dielectric materials are different from one another; and (ii) dielectric material of the upper and lower capacitors of the first stack comprises a first dielectric material having a selected thickness, and the dielectric material of the upper and lower capacitors of the second stack comprises a second dielectric material having a selected thickness, wherein the first and second dielectric materials are different from one another;

wherein the variation of the capacitance of the semiconductor device as a function of voltage includes a quadratic voltage coefficient; and wherein the contribution of the first capacitor stack to said quadratic voltage coefficient is countered by the contribution of the second capacitor stack to said quadratic voltage coefficient such that said quadratic voltage coefficient is minimized as a result of the selected one of said two configurations, the selected first and second dielectric materials, and said selected thicknesses of the first and second dielectric materials.

2. A semiconductor device according to claim 1, wherein the linear voltage coefficients of capacitance of the first and second dielectric materials have opposite signs.

3. A semiconductor device according to claim 1, wherein the quadratic voltage coefficients of capacitance of the first and second dielectric materials have opposite signs.

4. A semiconductor device according to claim 1, wherein one of the first and second dielectric materials comprises an oxide, and the other comprises a nitride.

5. A semiconductor device according to claim 1, wherein all of the capacitors are connected, or are arranged to be connected, in parallel.

6. A semiconductor device according to claim 1, wherein each lower and upper capacitor has a lower plate and an upper plate, wherein the lower plate of the upper capacitor of the first stack defines a first terminal of the composite capacitor structure and is connected to the upper plate of the lower capacitor of the first stack and is connected, or is arranged to be connected, to the upper plate of the upper capacitor of the second stack and to the lower plate of the lower capacitor of the second stack, and the device further comprises, or is arranged to receive, a second terminal of the composite capacitor structure connected, or arranged to be connected, to the upper plate of the upper capacitor of the first stack and to the lower plate of the lower capacitor of the first stack and to the lower plate of the upper capacitor of the second stack and to the upper plate of the lower capacitor of the second stack.

7. A semiconductor device according to claim 1, wherein the substrate is a common substrate for the two capacitor stacks.

8. A semiconductor device according to claim 1, wherein each capacitor is a MIM (Metal-Insulator-Metal) capacitor.

9. A semiconductor device according to claim 1, wherein the dielectric material of each individual capacitor is substantially uniform.

10. A semiconductor device according to claim 1, wherein a first breakdown voltage of the composite capacitor is less than a second breakdown voltage of each upper capacitor and a third breakdown voltage of each lower capacitor.

11. A semiconductor device according to claim 1, wherein the first and second capacitor stacks are connected to each other with their terminals cross wired.

12. A semiconductor device according to claim 1, wherein the semiconductor device is configured according to configuration (i).

13. A semiconductor device according to claim 1, wherein the semiconductor device is configured according to configuration (ii).

* * * * *